(12) United States Patent
Chen et al.

(10) Patent No.: US 6,982,878 B2
(45) Date of Patent: Jan. 3, 2006

(54) MOUNTING APPARATUS FOR CIRCUIT BOARDS

(75) Inventors: Yun-Lung Chen, Tu-Cheng (TW); Xian-Huang Gao, Shenzhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 10/988,466

(22) Filed: Nov. 12, 2004

(65) Prior Publication Data

US 2005/0128723 A1    Jun. 16, 2005

(30) Foreign Application Priority Data

Dec. 13, 2003   (CN) ............................... 20119339 A

(51) Int. Cl.
H05K 7/14    (2006.01)
H05K 7/18    (2006.01)

(52) U.S. Cl. .................. 361/801; 361/803; 361/809; 361/807

(58) Field of Classification Search ............. 361/801, 361/807, 809, 683, 759, 825, 732, 740, 747, 361/726; 174/52.1, 138 E, 138 D
See application file for complete search history.

(56) References Cited

U.S. PATENT DOCUMENTS

| | | | | |
|---|---|---|---|---|
| 4,964,017 A | * | 10/1990 | Jindrick et al. | 361/683 |
| 5,373,104 A | * | 12/1994 | Brauer | 174/52.1 |
| 5,490,038 A | * | 2/1996 | Scholder et al. | 361/759 |
| 5,691,504 A | * | 11/1997 | Sands et al. | 174/35 R |
| 5,754,396 A | | 5/1998 | Felcman et al. | |
| 5,973,926 A | * | 10/1999 | Sacherman et al. | 361/759 |
| 6,114,626 A | * | 9/2000 | Barnes et al. | 174/52.1 |
| 6,186,800 B1 | * | 2/2001 | Klein et al. | 439/95 |
| 6,362,978 B1 | * | 3/2002 | Boe | 361/825 |
| 6,377,445 B1 | * | 4/2002 | Davis et al. | 361/683 |
| 6,813,165 B2 | * | 11/2004 | Cheng et al. | 361/801 |
| 2003/0031004 A1 | * | 2/2003 | Hooper | 361/801 |
| 2004/0125575 A1 | * | 7/2004 | Chen et al. | 361/759 |

* cited by examiner

Primary Examiner—Kamand Cuneo
Assistant Examiner—Hung S. Bui
(74) Attorney, Agent, or Firm—Morris Manning & Martin; Tim Tingkang Xia, Esq.

(57) ABSTRACT

A mounting apparatus for mounting a motherboard (10) having several first mounting holes (13) includes a chassis (80), a fixing member (40), and a supporting member (20). The chassis comprised two posts (13) protruding from a bottom wall (81) thereof, and a number of standoffs (82) received in first the mounting hole. The fixing member is horizontally slidably mounted to the posts, and includes a first engaging portion (42) and a first locating portion (54). The supporting member is attached to the motherboard, and includes a second engaging portion (26) and a second locating portion (29). When the circuit board together with the supporting member is mounted to the chassis, the first locating portion engages with the second locating portion. When the circuit board together with the supporting member is disassembled from the chassis, the first engaging portion exerts force on the second engaging portion.

23 Claims, 6 Drawing Sheets

MOUNTING APPARATUS FOR CIRCUIT BOARDS

BACKGROUND OF THE INVENTION

1. Field of the Invention

The present invention relates to mounting apparatuses for circuit boards, and particularly to a mounting apparatus that readily attach a circuit board onto a computer chassis.

2. Description of Related Art

For many years, the conventional method of installing a circuit board, such as a motherboard, in a computer was to simply screw the motherboard on a chassis of the computer. This motherboard installation method substantially increases the time and the cost because of the complexity and difficulty of the assembled or the disassembled.

An improvement in the mounting of a motherboard in a computer is illustrated and described in U.S. Pat. No. 5,754,396. In this patent, the motherboard is mounted to a projection structure that can be slid into and out of a computer chassis to install and later remove the motherboard for access and service purpose.

While this projection structure hastens and reduces the cost associate with initially installing the motherboard in the chassis and subsequently removing the motherboard for service and replacement, it also increases the manufacturing cost of the computer since a configuration of the projection structure is complex.

A new mounting apparatus for circuit boards that overcomes the above-mentioned problems is desired.

SUMMARY OF THE INVENTION

An object of the present invention is to provide a mounting apparatus which can readily attach a circuit board onto a chassis.

In order to achieve the above object, a mounting apparatus in accordance with a preferred embodiment of the present invention comprises a chassis for mounting a motherboard, a fixing member, a supporting member, and a coil spring received in the fixing member. The motherboard defines several first mounting holes. The chassis comprises a pair of posts arranged on a bottom wall thereof, and a plurality of standoffs received in the first mounting holes respectively. The fixing member is horizontally movably mounted to the posts of the chassis. The fixing member comprises a first engaging portion and a first locating portion. The supporting member is attached to the motherboard, and comprises a second engaging portion and a second locating portion corresponding to the first engaging portion and the first locating portion respectively. When the circuit board together with the supporting member is mounted to the chassis, the first locating portion of the fixing member engages with the second locating portion of the supporting member; when the circuit board together with the supporting member is disassembled from the chassis, the first engaging portion of the fixing member exerts force on the second engaging portion of the supporting member.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
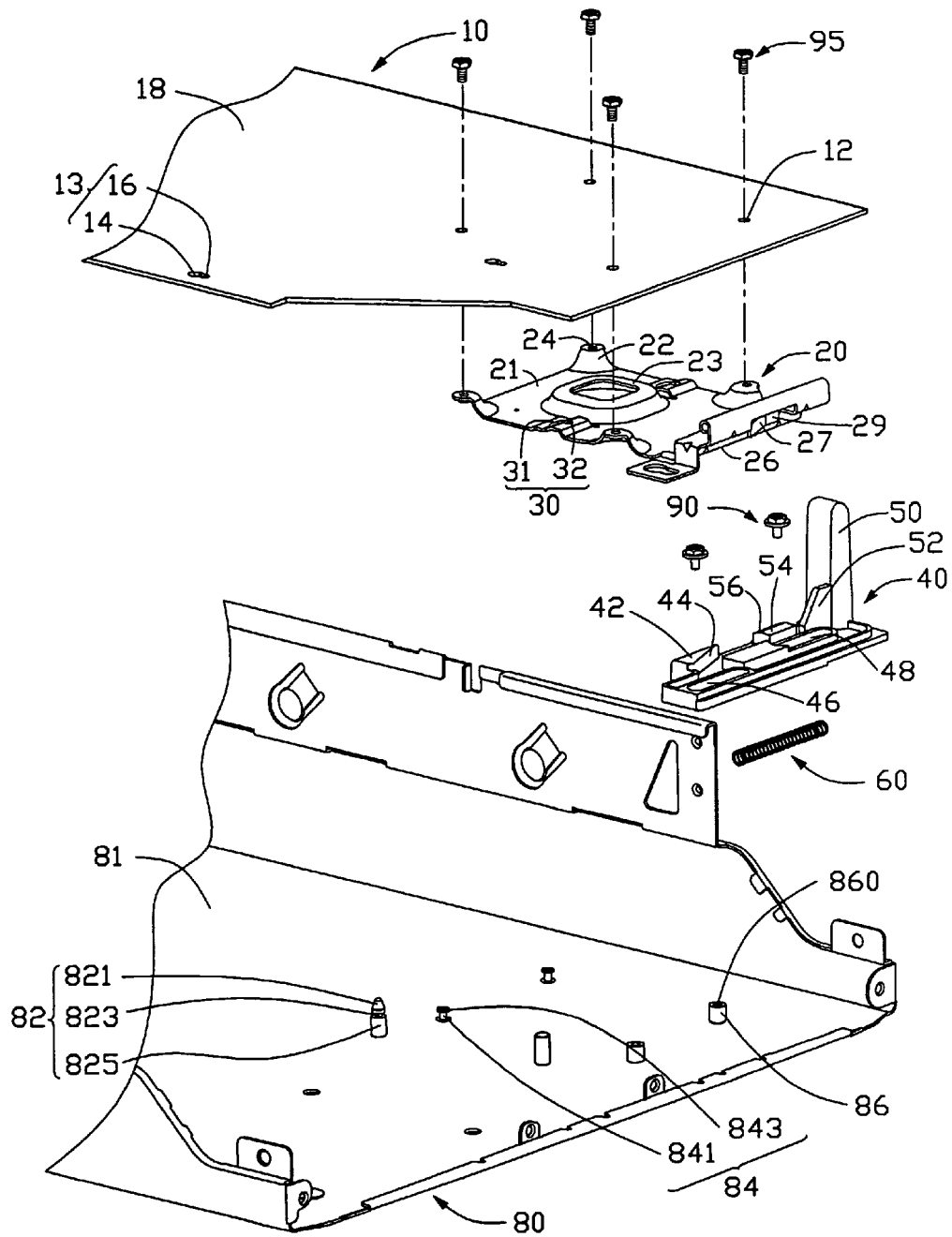
FIG. 1 is an exploded, isometric view of a mounting apparatus in accordance with a preferred embodiment of the present invention, together with a motherboard.

FIG. 1 shows a mounting apparatus in accordance with the preferred embodiment of the present invention, together with a circuit board such as a motherboard 10. The mounting apparatus comprises a supporting member 20, a fixing member 40, a coil spring 60 and a chassis 80.

The motherboard 10 is mounted to the chassis 80. The motherboard 10 has a generally planar, rectangular substrate body 18. The substrate body 18 defines several first mounting holes 13 therethrough, and four through holes 12 near an end thereof. Each first mounting hole 13 is generally calabash-shaped. The first mounting hole 13 has a first narrow portion 16, and a first broad portion 14.

The chassis 80 has a bottom wall 81. The bottom wall 81 has several upstanding first standoffs 82 corresponding to the first mounting holes 13 of the motherboard 10 respectively. Each standoff 82 includes cylindrical base portion 825, a generally conically shaped upper end portion 821, and a neck portion 823 between the base portion 825 and the end portion 821. A diameter of the end portion 821 is smaller than that of the first broad portion 14 of the first mounting hole 13, and is greater than that of the first narrow portion 16 of the first mounting hole 13. A pair of fastener 84 protrudes from the bottom wall 81 for retaining the supporting member 20. Each fastener 84 has a cap portion 843, and a post portion 841. Two posts 86 project from the bottom wall 81 for mounting the fixing member 40. Each post 86 defines a threaded hole 860.

Figure 2:
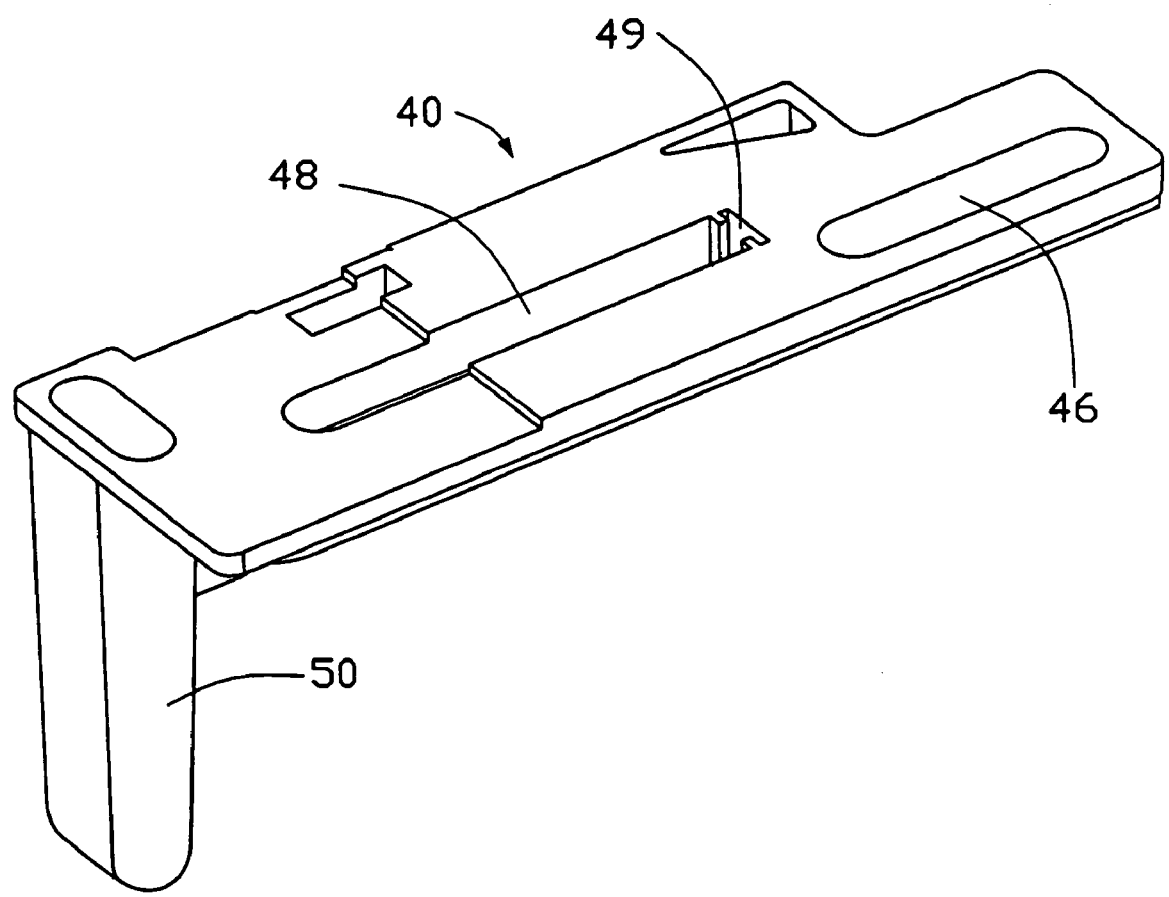
FIG. 2 is an enlarged view of a fixing member of the mounting apparatus of FIG. 1, but viewed from another aspect.
Figure 3:
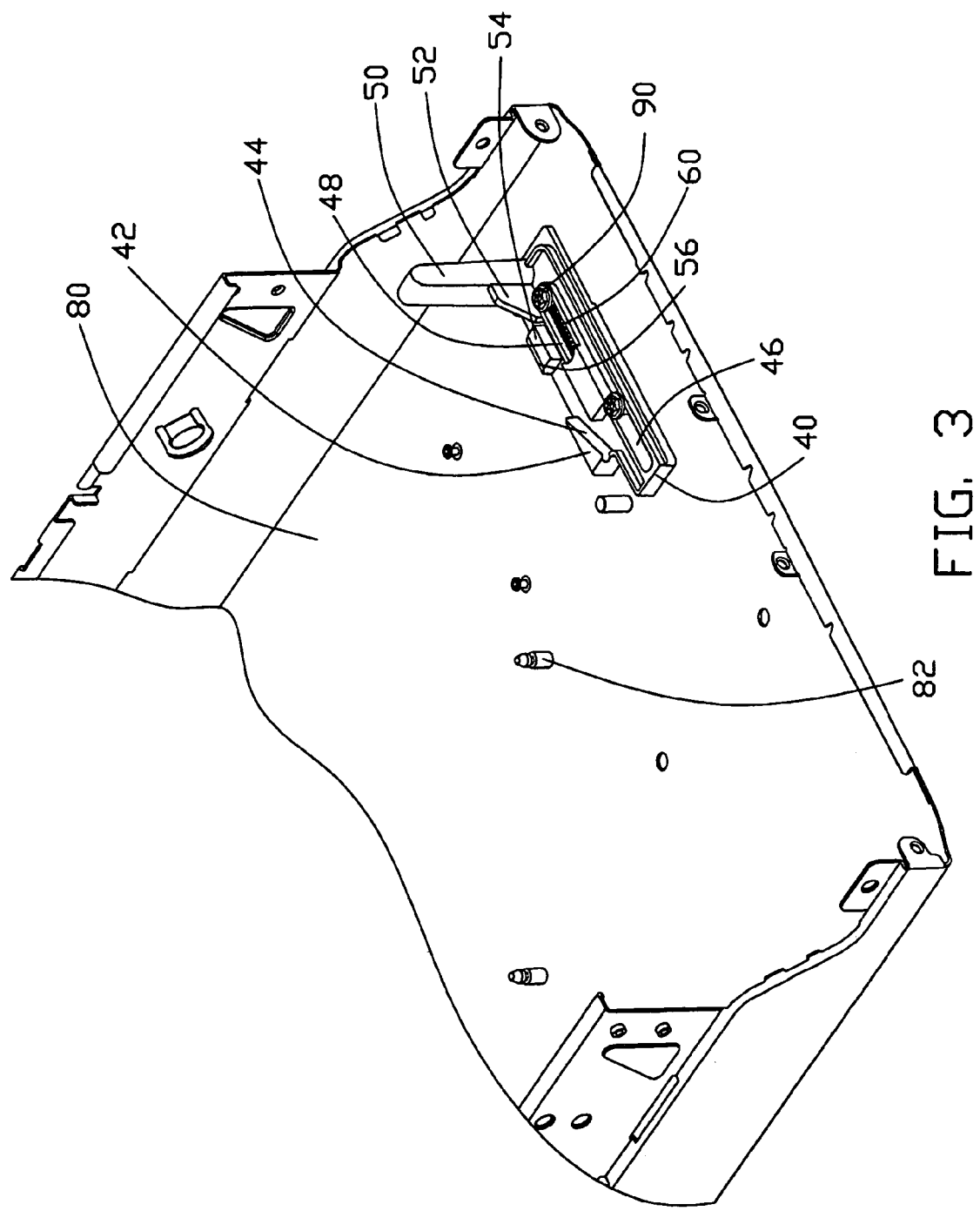
FIG. 3 is an assembled view of the fixing member and a chassis of the mounting apparatus of FIG. 1.

Referring also to FIGS. 2 and 3, the fixing member 40 is movably mounted to the posts 86 of the chassis 80. The fixing member 40 defines two grooves 46, 48, corresponding to the posts 86 of the chassis 80. The groove 46 is not in a line with the groove 48. The groove 48 has a stop wall 49. The breadths of the grooves 46, 48 are smaller than a diameter of a head of a screw 90, respectively, so that the fixing member 40 cannot disengage from the chassis 80 when the fixing member 40 is mounted to the chassis 80. A handle 50 extends upwardly from an end of the fixing member 40, adjacent to the groove 48. A guiding portion 52 protrudes from an inside of the handle 50. A first locating portion 54 projects from a side of the fixing member 40, adjacent to the guiding portion 52. The first locating portion 54 includes a locating slope 56. A triangular first engaging portion 42 extends from the side of the fixing member 40, adjacent to the groove 46. The first engaging portion 42 has a slope 44 formed inside thereof. There is a space between the first locating portion 54 and the first engaging position 42.

Figure 4:
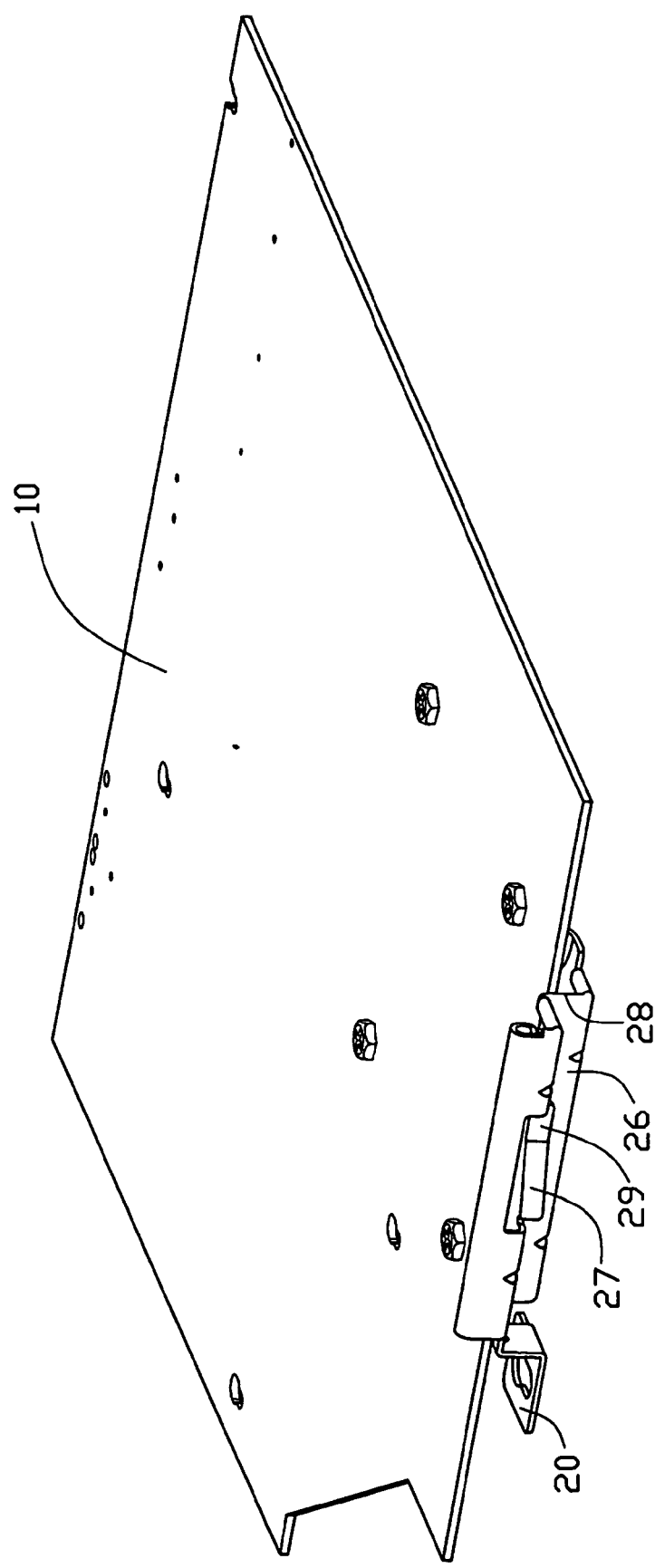
FIG. 4 is an assembled view of a supporting member of the mounting apparatus and the motherboard of FIG. 1.
Figure 5:
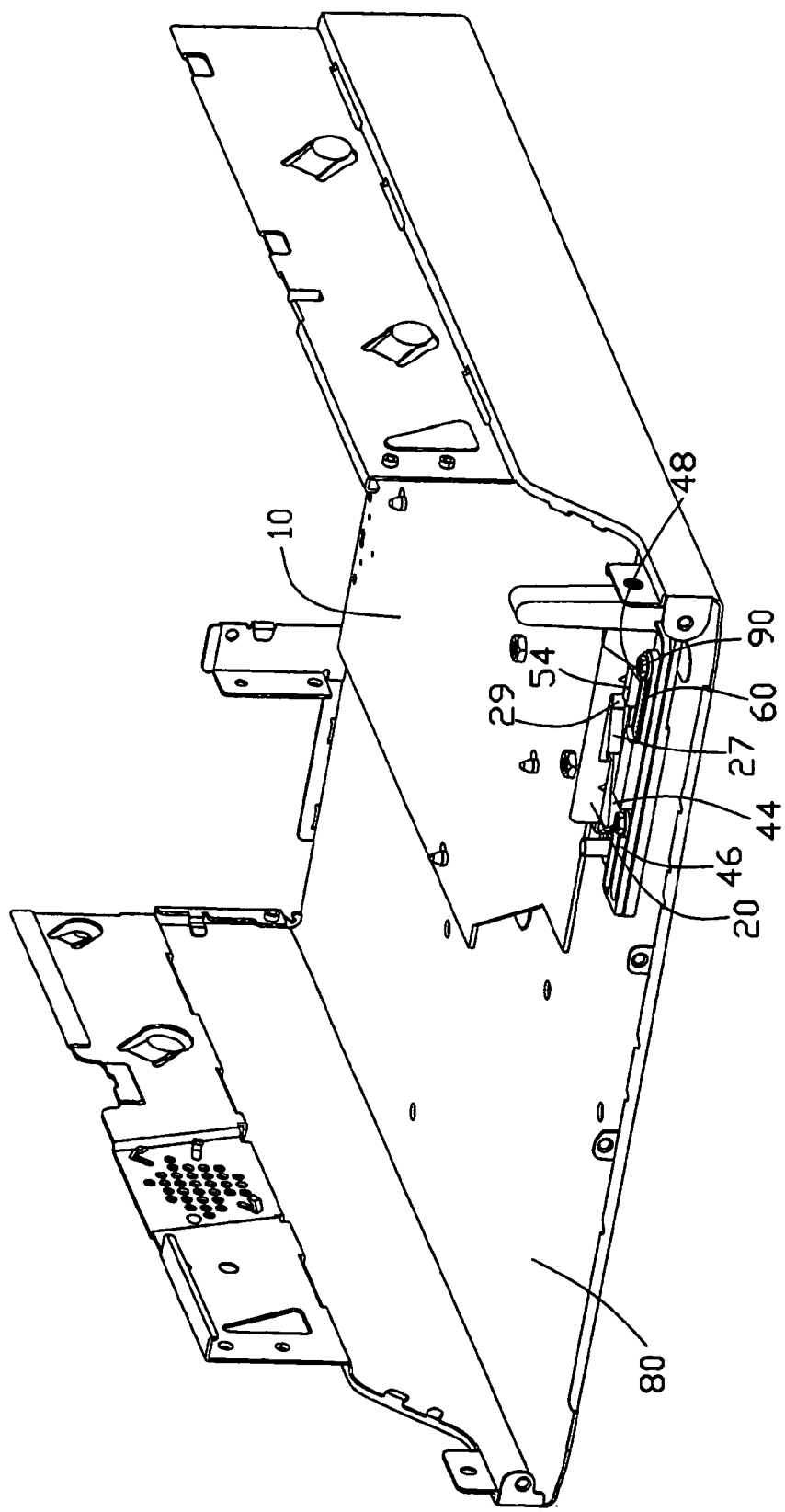
FIG. 5 is an assembled view of the mounting apparatus and the motherboard of FIG. 1, showing the motherboard in a first position.

Referring to FIGS. 1 and 4, the supporting member 20 is partially mounted below the motherboard 10. The supporting member 20 has a main portion 21. Four protruding portions 22 projects from four corners of the main portion 21 respectively. Each protruding portion 22 defines a threaded hole 24 corresponding to the hole 12 of the motherboard 10. An annular projection 23 protrudes from a center of the main portion 21 for supporting the motherboard 10. A pair of second mounting holes 30 is defined in the main portion 21 and located at opposite sides of the projection 23. Each second mounting hole 30 is also generally calabash-shaped. The second mounting hole 30 has a second narrow portion 32, and a second broad portion 31. A diameter of the second narrow portion 32 is smaller than that of the cap portion 843 of the fastener 84, and the diameter of the cap portion 843 of the fastener 84 is smaller than that of the second broad portion 31. An L-shaped bend portion 26 protrudes from a distal end of the main portion 21. The bend portion 26 has a slopy second engaging portion 27 corresponding to the first engaging portion 42, and a second locating portion 29 corresponding to the first locating portion 54.

Referring to FIGS. 1–5, in assembly, the posts 86 of the chassis 80 are received in the grooves 46, 48 of the fixing member 40, respectively. The screws 90 are threadedly retained in the corresponding posts 86. The coil spring 60 is received in the groove 48 of the fixing member 40. One end of the coil spring 60 abuts against the stop wall 49 of the groove 48, and the other end of the coil spring 60 is fixed on the post 86. The fixing member 40 is thereby slidably mounted to the chassis 80. The screws 95 are threadedly received in the corresponding threaded holes 24 of the supporting member 20 through the holes 12 of the motherboard 10 accordingly the motherboard 10 is engaged with the supporting member 20. The standoffs 82 of the chassis 80 are received in the corresponding first broad portions 14 of the first mounting holes 13 of the motherboard 10. The fasteners 84 are received in the second broad portions 31 of the second mounting holes 30 of the supporting member 20. A side 28 of the bend portion 26 of the supporting member 20 exerts force on the guiding portion 52 of the fixing member 40 to cause the fixing member 40 to move in a first direction with the coil spring 60 being compressed. The motherboard 10 is pushed in a second direction perpendicular to the first direction, until the standoffs 82 are received in the corresponding first narrow portions 16 of the motherboard 10, and the fasteners 84 are received in the corresponding second narrow portions 32 of the supporting member 20. Thus, the motherboard 10 together with the supporting member 20 is assembled to the chassis 80. In this position, the motherboard 10 is defined in a first position. In the first position, the first locating portion 54 of the fixing member 40 abuts against the second locating portion 29 of the supporting member 20. The coil spring 60 decompresses. The bend portion 26 of the supporting member 20 disengages from the guiding portion 52 of the fixing member 40.

Figure 6:
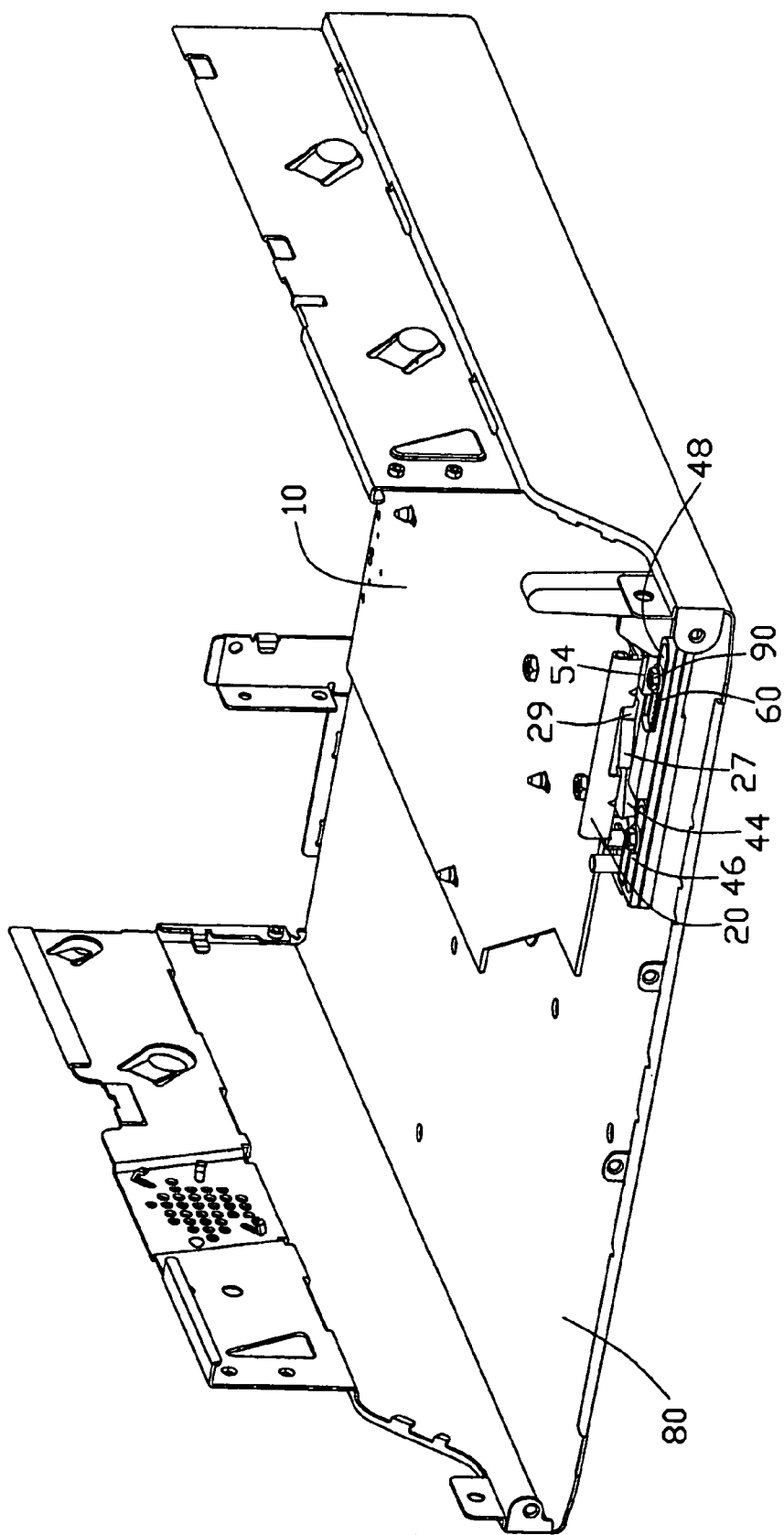
FIG. 6 is similar to FIG. 5, but showing the motherboard in a second position.

Referring also to FIG. 6, in removal of the motherboard 10 from the chassis 80, the handle 50 of the fixing member 40 is operated to cause fixing member 40 to move in the first direction with the coil spring 60 being compressed. The slope 44 of the first engaging portion 42 of the fixing member 40 exerts force on the second engaging portion 27, so that the motherboard 10 is moved in a third direction opposite to the second direction. The standoffs 82 move to the first broad portions 14 of the motherboard 10 respectively. The fasteners 84 move to the second broad portions 31 of the supporting member 20 respectively. Thus, the motherboard 10 together with the supporting member 20 is ready to be removed from the chassis 80. In this position, the motherboard 10 is defined in a second position.

In the first position, the first locating portion 54 of the fixing member 40 abuts against the second locating portion 29 of the supporting member 20, so that the motherboard 10 cannot move in the third direction. Simultaneously, the diameter of the first narrow portion 16 of the first mounting hole 13 is smaller than that of the end portion 821 of the standoff 82. The diameter of the second narrow portion 532 of the second mounting hole 53 is smaller than that of the cap portion 151 of the fastener 84. Therefore, the motherboard 10 together with the supporting member 20 is stably fixed in the first position.

While a preferred embodiment in accordance with the present invention have been shown and described, equivalent modifications and changes known to persons skilled in the art according to the spirit of the present invention are considered within the scope of the present invention as defined in the appended claims.

What is claimed is:

1. A mounting apparatus for mounting a circuit board, the mounting apparatus comprising:
    a chassis comprising a plurality of standoffs for securing the circuit board;
    a fixing member mounted to the chassis and movable horizontally along the chassis, the fixing member comprising a first engaging portion and a first locating portion; and
    a supporting member attached to a circuit board, the supporting member comprising a second engaging portion and a second locating portion corresponding to the first engaging portion and the first locating portion respectively; wherein
    when the circuit board together with the supporting member is mounted to the chassis, the circuit board is moved in a first direction until the first locating portion of the fixing member engages with the second locating portion of the supporting member to prevent the circuit board from moving in a second direction opposite to the first direction; the first engaging portion of the fixing member exerts force on the second engaging portion of the supporting member to cause the circuit board move in the second direction so that the circuit board together with the supporting member is disassembled from the chassis.

2. The mounting apparatus as described in claim 1, wherein a pair of posts projects from a bottom wall of the chassis, the fixing member defines a pair of grooves corresponding to the posts.

3. The mounting apparatus as described in claim 2, wherein each of the posts defines a threaded hole, a fastener is received in the threaded hole.

4. The mounting apparatus as described in claim 3, wherein a resilient member is received in one of the grooves having a stop wall; one end of the resilient member abuts against the stop wall, and the other end of the resilient member is fixed to the post receiving said groove.

5. The mounting apparatus as described in claim 1, wherein an L-shaped bend portion extends from a distal end of the supporting member, the second engaging portion and the second locating portion are formed on the bend portion; the second engaging portion is slopy.

6. The mounting apparatus as described in claim 5, wherein the first engaging portion has a slope engaging with the second engaging portion.

7. The mounting apparatus as described in claim 1, wherein a handle extends upwardly from an end of the fixing member.

8. The mounting apparatus as described in claim 7, wherein a guiding portion is formed in an inside of the handle.

9. The mounting apparatus as described in claim 1, wherein a pair of fasteners project from the chassis, the supporting member defines a pair of second mounting holes engaging with the fasteners respectively.

10. A circuit board mounting apparatus assembly comprising:
   a circuit board defining a plurality of first mounting holes therethrough, each of the first mounting holes having a first narrow portion and a first broad portion;
   a chassis for mounting the circuit board, the chassis comprising a plurality of standoffs movably received in the first mounting holes respectively;
   a fixing member slidably mounted to the chassis, the fixing member comprising a first engaging portion;
   a resilient member received in the fixing member; and
   a supporting member attached to the circuit board, the supporting member comprising a second engaging portion corresponding to the first engaging portion; wherein
   when the circuit board together with the supporting member is mounted to the chassis, the supporting member applies force on the fixing member to cause the fixing member to move in a first direction with the resilient member being compressed, the circuit board is moved in a second direction perpendicular to the first direction so that the standoffs engage with the first narrow portions of the first mounting holes; when the circuit board together with the supporting member is dissembled from the chassis, the first engaging portion exerts force on the second engaging portion to cause the circuit board to move in a third direction opposite to the second direction so that the standoffs engage with the first broad portions of the first mounting holes.

11. The circuit board mounting apparatus assembly as described in claim 10, wherein the resilient member is a coil spring.

12. The circuit board mounting apparatus assembly as described in claim 11, wherein a pair of posts projects from a bottom wall of the chassis, the fixing member defines a pair of grooves corresponding to the posts.

13. The circuit board mounting apparatus assembly as described in claim 12, wherein each of the posts defines a threaded hole, a fastener is received in the threaded hole.

14. The circuit board mounting apparatus assembly as described in claim 13, wherein the coil spring is received in one of the grooves having a stop wall; one end of the coil spring abuts against the stop wall, and the other end of the coil spring is fixed to the post receiving said groove.

15. The circuit board mounting apparatus assembly as described in claim 10, wherein a pair of fasteners projects from the chassis, the supporting member defines a pair of second mounting holes engaging with the fasteners respectively.

16. The circuit board mounting apparatus assembly as described in claim 10, wherein a first locating portion protrudes from the fixing member.

17. The circuit board mounting apparatus assembly as described in claim 16, wherein an L-shaped bend portion protrudes from a distal end of the supporting member, and comprises a second locating portion corresponding to the first locating portion; the second engaging portion is sloppy and adjacent to the second locating portion.

18. The circuit board mounting apparatus assembly as described in claim 17, wherein the first engaging portion has a slope for engaging with the second engaging portion.

19. The circuit board mounting apparatus assembly as described in claim 10, wherein a handle extends upwardly from the fixing member.

20. The circuit board mounting apparatus assembly as described in claim 19, wherein a guiding portion is formed in an inside of the handle.

21. A mounting apparatus for securing a circuit board to a chassis of an electronic device, comprising:
   a fixing member slidably mounted to the chassis and movable resiliently along a first direction, said fixing member comprising a first engaging portion; and
   a supporting member attached to a circuit board and movable together with said circuit board in a second direction perpendicular to said first direction, said supporting member comprising a second engaging portion corresponding to and reachable to said first engaging portion, movement of said fixing member along said first direction leading to engagement of said first engaging portion and said second engaging portion and thereby movement of said supporting member and said circuit board along said second direction from a first position where said circuit board is secured with respect to said chassis to a second position where said circuit board is releasably movable away from said chassis.

22. The mounting apparatus as described in claim 21, wherein said chassis has a plurality of standoffs to secure said circuit board in said first position.

23. The mounting apparatus as described in claim 21, wherein said first engaging portion has a slope and said second engaging portion has an L-shaped bend portion to move along said slope when said engagement of said first and second engaging portions commences.

* * * * *